United States Patent [19]

Rietsch et al.

[11] Patent Number: 5,208,537
[45] Date of Patent: May 4, 1993

[54] METHOD FOR MATCHING ANTENNAS IN A NUCLEAR MAGNETIC RESONANCE IMAGING APPARATUS

[75] Inventors: Norbert Rietsch, Dormitz; Markus Vester, Erlangen; Horst Kroeckel, Bamberg, all of Fed. Rep. of Germany

[73] Assignee: Siemens Aktiengesellschaft, Munich, Fed. Rep. of Germany

[21] Appl. No.: 788,593

[22] Filed: Nov. 6, 1991

[30] Foreign Application Priority Data

Nov. 12, 1990 [DE] Fed. Rep. of Germany ....... 4035994

[51] Int. Cl.$^5$ ............................................. G01R 33/20
[52] U.S. Cl. .................................... 324/322; 324/318
[58] Field of Search ............... 324/300, 307, 309, 318, 324/322; 128/653.5; 335/219

[56] References Cited

U.S. PATENT DOCUMENTS 4,739,269  4/1988  Kopp ..................................... 324/318
4,792,960  12/1988  Jacob et al. ........................... 324/322

FOREIGN PATENT DOCUMENTS 0114405  12/1983  European Pat. Off. .
0186238  12/1985  European Pat. Off. .
3728863   3/1989  Fed. Rep. of Germany .

Primary Examiner—Michael J. Tokar
Attorney, Agent, or Firm—Hill, Steadman & Simpson

[57] ABSTRACT

In a method for matching a transmission/reception antenna in a nuclear magnetic resonance imaging apparatus to the impedance of a high-frequency system which feeds the antenna, a directional coupler is used for acquiring respective signals corresponding to a forward voltage wave supplied to the antenna, and the associated return voltage wave. The amplitudes of the forward and return waves are calculated in a controller for all matching conditions of a transformation network, the transformation network being interconnected between the high frequency system and the antenna. When a tomogram is to be produced, the transformation network is set so that the antenna is matched as best as is possible to the high-frequency system. The same method can be used for matching an antenna which is only used for reception when producing tomograms.

16 Claims, 2 Drawing Sheets

METHOD FOR MATCHING ANTENNAS IN A NUCLEAR MAGNETIC RESONANCE IMAGING APPARATUS

BACKGROUND OF THE INVENTION

1. Field of the Invention

The present invention relates to a method for matching antennas in a nuclear magnetic resonance imaging apparatus, such as a transmission/reception antenna or a reception antenna, to a high-frequency system connected to the antenna, and in particular to such a method wherein the matching ensues by setting a transformation network connected between the antenna and the high-frequency system.

2. Description of the Prior Art

Nuclear magnetic resonance imaging systems are used in medical diagnostics for producing tomograms of the human body. To that end, high-frequency electromagnetic signals are generated as a reaction to the excitation of the atomic nuclei in the body, and these electromagnetic signals are evaluated after being received by an antenna or by a resonator. The received signals are low-power, and must therefore be processed and evaluated without losses insofar as possible. This means that the signal-to-noise ratio cannot be significantly deteriorated in the individual steps of the signal processing.

A critical point in the signal processing chain is the detuning of the resonator due to the patient under examination. Such detuning is essentially defined by the size of the patient. Mismatches occur due to the detuning, and thus undesired reflections occur at the interface between the resonator and the high-frequency system connected thereto. Optimum power matching is thereby also disturbed.

In commercially available nuclear magnetic resonance imaging systems, the resonators are matched to the patient to avoid signal losses, or to reduce such losses to an uncritical level. A tuning path is provided for this purpose in addition to the transmission path and the reception path, with the impedance of the resonator being varied via this tuning path by means of variable capacitors so that optimum matching conditions are again present when a tomogram is produced. This tuning path constitutes a considerable portion of the overall electronics.

A magnetic resonance imaging apparatus is disclosed in German OS 37 28 863 wherein mismatches of a transmission/reception antenna caused by a patient are leveled. The reflection factor is continuously identified with a directional coupler during operation, and is forwarded as an actual value to a regulator. By comparing this reflection factor as the actual value with a rated (desired) value of zero for the reflection factor, the regulator forms a manipulated variable which is used to vary the capacitances in a transformation network. This control method is especially suitable for continuous wave (cw) mode. A change in the impedance during the measurement, however, is disadvantageous given certain pulse sequences and causes artifacts in the tomogram. Moreover, the method cannot be applied to a pure reception antenna.

European Application 0 114 405 discloses a circuit for undertaking automatic tuning of the reception antenna, the automatic tuning being implemented before a tomogram is produced. To that end, a plurality of transmission/reception cycles are conducted in a first disclosed method. First, a slice of the patient is excited with a transmission signal, and the amplitude of the reception signal following thereupon is stored. This procedure is repeated several times, with the transmission/reception antenna being detuned step-by-step by a tuning circuit before each transmission/reception cycle. The tuning at which the maximum reception signal occurs is also used for generating the tomogram. In a second method, a reception antenna is tuned without implementing an NMR transmission/reception cycle. A high-frequency signal is directly supplied to the reception circuit. After step-by-step detuning, the setting at which the largest signal amplitude occurred is selected. In both methods, only the amplitude changes due to the changes in the resonant properties of the antenna are interpreted for tuning, without taking the matching of the antenna to the impedance of the high-frequency system connected thereto into consideration. Despite antennas tuned to resonance, reflections and losses can still occur due to the non-matched impedances. In addition, the patient is stressed in the first tuning method by the high-power, high-frequency transmission pulses.

SUMMARY OF THE INVENTION

It is an object of the present invention to provide a method by which a transmission/reception antenna, or a reception antenna, in a nuclear magnetic resonance imaging apparatus can be rematched to the output impedance, or input impedance of the high-frequency system connected thereto, given a mismatch caused by the presence of a patient.

It is a further object of the present invention to provide such a method wherein the stress on the patient caused by exposure to high-frequency energy is low.

The objects are achieved in a method for use with a transmission/reception antenna, wherein a voltage wave associated with a high-frequency pulse generated by the high-frequency system is supplied for transmission by the transmission/reception antenna. The pulse has a pulse length between 1 ms and 50 ms, and a power on the order of magnitude of 100 W. This transmission wave results in a reflected return voltage wave, from the transmission/reception antenna. Both the outbound wave and the reflected return wave are acquired by a directional coupler. The measured values corresponding to both of these waves are demodulated in a measured value editing circuit. A ratio between the amplitudes of the outbound and the returning waves is formed in a controller, and this ratio is stored. A transformation network is connected between the high-frequency system and the transmission/reception antenna, the transformation network being settable to a plurality of different impedances. The above steps are repeated, and the ratio of the outbound wave to the returning wave is stored, for each impedance which can be set with the transformation network. When a tomogram is to be generated, the transformation network is set at an impedance which resulted in the generation of an extreme ratio value among the stored ratio values. If the ratio which was formulated was that of the amplitude of the outbound wave to the returning wave the extreme value will be the largest ratio value among the stored values. If the ratio which was formulated was that of the returning wave to the outbound wave, the extreme ratio will be the smallest among the stored ratios.

For a reception antenna, the above objects are achieved by the following method. The high-frequency system generates a pulsed or continuous-wave high-frequency signal having a power below −10 dBm, which is coupled to the reception antenna via the coupling path of a directional coupler. The associated returning wave is conducted to the high-frequency system via the direction-independent primary path of the directional coupler, and is demodulated. The amplitude of the returning wave is stored in a controller. Again, a transformation network is connected between the high-frequency system and the reception antenna. The above steps are repeated for all impedances of the reception antenna which can be set by means of the transformation network, and the respective amplitudes of the returning waves associated with each settable impedance are stored. The impedance of the reception antenna for producing a tomogram is then set using the transformation network at the impedance value which was associated with the smallest returning wave amplitude among the stored amplitudes.

In both of the above matching methods, the impedance of an antenna or of a resonator in a nuclear magnetic resonance imaging apparatus, which is detuned by the presence of a patient, is rematched to the impedance of the high-frequency system connected to the antenna or resonator. Losses in the signal amplitudes due to reflections are thus suppressed. Complete NMR transmission/reception cycles need not be undertaken for matching; a relatively low-power high-frequency signal is sufficient. The high-frequency stress on the patient during matching is thus negligibly low. The matching can be implemented using electronics units which are present in any event for producing tomograms and for protecting the patient. Only a slight additional equipment outlay is thus required. The added equipment is substantially limited to that needed for changing the impedance of the antenna, i.e., the transformation network. The cost and the space requirements for accomplishing matching of the resonator or antenna are thus maintained low.

The transformation network preferably is formed by a number of variable capacitors, which can preferably be switched in steps to different capacitance values. The number of switching steps is selected so that the signal-to-noise ratio is maintained above a given lower level. A slight mismatching is accepted as a result of this additional condition, however this does not degrade the image quality. The time required for tuning is reduced using step-by-step setting, in comparison to a continuous variation of the capacitance values. The number of steps is dependent on the noise factor of the high-frequency receiver, and the step graduation can be made more coarse as the noise factor becomes lower. Given a noise factor of approximately 0.5 dB, visible deteriorations in the image occur only given a reflection factor of greater than 30% caused by mismatching.

DESCRIPTION OF THE PREFERRED EMBODIMENTS

Figure 1:
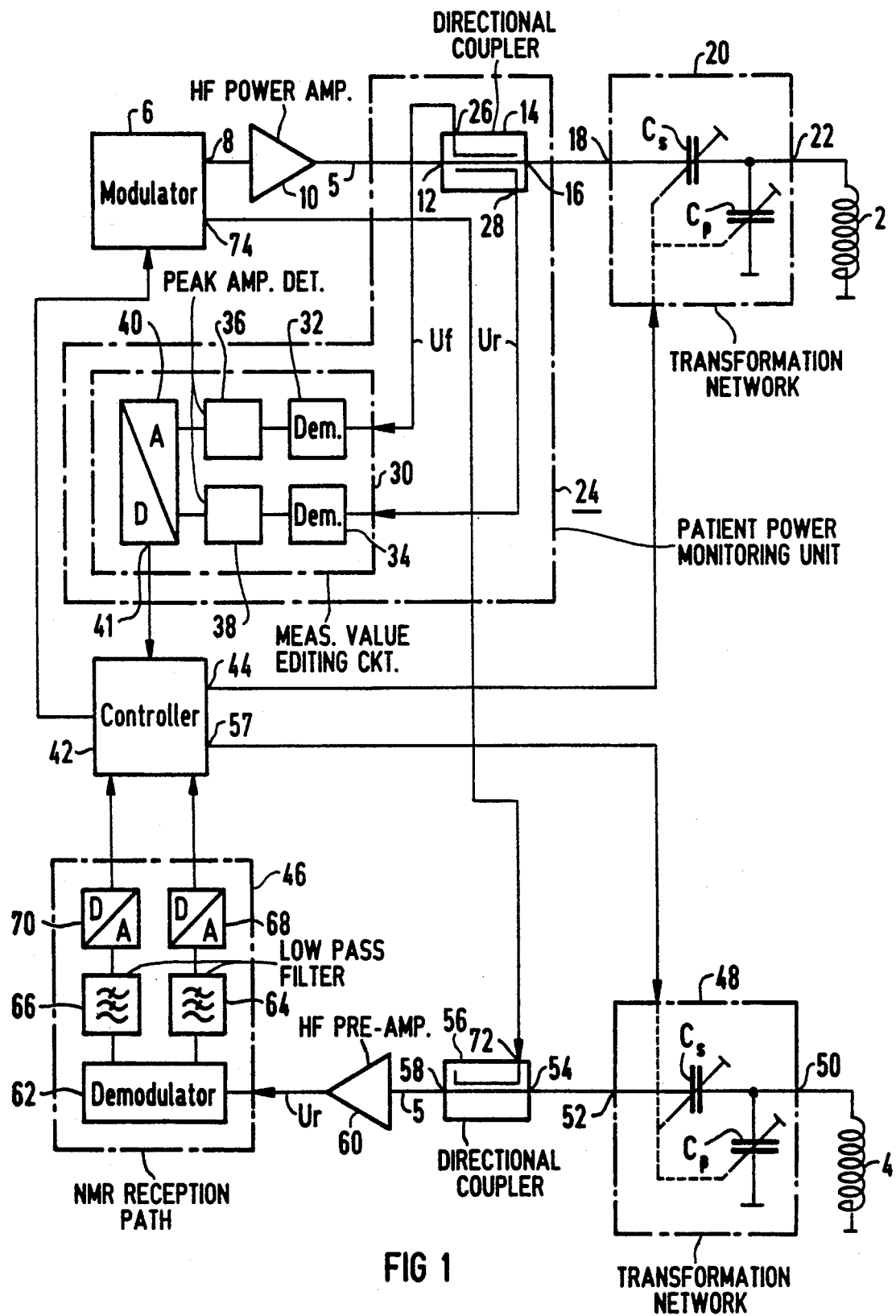
FIG. 1 is a block circuit diagram of a circuit for matching a transmission/reception antenna, or a reception antenna, which practices the methods in accordance with the principles of the present invention.

In FIG. 1, a coil referenced 2 represents a transmission/reception antenna or a resonator, which is used both for transmission and reception as a whole body antenna, or a body resonator, in a nuclear magnetic resonance imaging apparatus (NMR apparatus). The antenna or resonator must transmit signals having a high-pulse power on the order of magnitude of several kilowatts, and must also be able to pick up extremely low-power reception signals. A precise matching of the resonator or the antenna to the impedance of, for example, 50 ohms of a high-frequency system connected thereto is necessary, particularly in a reception mode.

A coil 4 represents a reception antenna or a resonator which is designed only for the reception of weak high-frequency signals as employed, for example, as a head coil in a nuclear magnetic resonance imaging apparatus. The reception antenna 4 must also be matched to the impedance of a high-frequency system connected thereto.

The matching of the antennas or resonators 2 or 4 is disturbed by the presence of a patient, the disturbance being substantially dependent on the size of the patient. To avoid losses due to reflection caused as a result thereof, the antennas or resonators 2 or 4 must be rematched to the impedance of the high-frequency systems respective connected thereto. The high-frequency system connected to the antennas 2 or 4 is usually a high-frequency line 5, which connects the antenna 2 or 4 to the electronics of the nuclear magnetic resonance imaging apparatus.

The circuit for matching or tuning the transmission/reception antenna 2 will be described first. A modulator 6, which prescribes the type and the chronological duration of high-frequency transmission pulses, has an output 8 connected to a high-frequency power amplifier 10. The output of the high-frequency power amplifier 10 is connected via the high-frequency line 5 to the input 12 of a directional coupler 14. An output 16 of the directional coupler 14 is connected to an input 18 of a transformation network 20. The coil 2 (resonator or antenna) is connected to an output 22 of the transformation network 20.

The directional coupler 14 is part of a patient power monitoring unit 24, with which the high-frequency power absorbed by the patient during the production of tomograms is measured and monitored with respect to a limit value. To that end, the power supplied by the high-frequency power amplifier 10 in the form of a voltage wave proceeding to the transmission/reception antenna 2, and the power reflected from the transmission/reception antenna 2 in the form of a return voltage wave, are measured by the directional coupler 14. The measured value Uf of the outbound wave is supplied at the output 26, and the measured value Ur of the return wave is supplied at the output 28. The signals at the outputs 26 and 28 are supplied to a measured value editing circuit 30 in the patient power monitoring unit 24. The measured value editing circuit 30 includes two demodulators 32 and 34 which respectively demodulate the high-frequency signals of the forward wave UF and of the return wave Ur. The measured value editing circuit 30 also includes two peak value detectors 36 and 38, respectively connected to the outputs of the demodulators 32 and 34. The peak value detectors 36 and 38 each acquire the highest values of the demodulated measured values of the forward wave Uf and the return wave Ur, and thus acquire the amplitude of the envelope of those signals, and store those values for a designated time. The outputs of the peak value detectors 36 and 38 are both supplied to an analog-to-digital converter 40, which digitizes the stored amplitudes.

The output 41 of the analog-to-digital converter 40 is connected to a controller 42, which undertakes further processing of the digitized values. The controller 42 has an output 44 connected to the transmission network 20 for supplying a control signal thereto which causes the impedance of the transmission/reception antenna 2 to be varied. The transformation network 20 contains a parallel capacitor $C_p$ which is connected in parallel with the transmission/reception antenna 2, and a series capacitor $C_s$ which is connected in series with the parallel circuit of the transmission/reception antenna 2 and the parallel capacitor $C_p$. The respective capacitances of the capacitors $C_s$ and $C_p$ are varied by means of the control signal supplied at the output 44 of the controller 42, thereby changing the impedance of the transmission/reception antenna 2. Tuning is implemented with the following method steps.

At an initial setting of the tuning capacitors $C_s$ and $C_p$, the high-frequency power amplifier 10 supplies a high-frequency transmission signal of approximately 100 watts to the transmission/reception antenna 2 via the directional coupler 14 and via the transformation network 20. A power of approximately 100 watts is necessary so that the high-frequency signal is in the linear region of the demodulator 34. The demodulator 34 is designed so that, in an NMR transmission mode, it can demodulate signals having peak powers of several kilowatts for measuring the power absorbed by the patient. Given mismatching of the antenna 2, a return wave arises whose measured value Ur, as is the measured value Uf of the forward wave, is demodulated and is stored in terms of its amplitude. The ratio (either Ur/Uf or Uf/Ur) of the amplitudes of the return and forward waves is formed and stored in the controller 42. The transmission event is then repeated with different capacitance values of the capacitors $C_s$ and $C_p$, until the ratios of the return and forward waves are stored for all possible capacitance values. When an actual diagnosis, is to be undertaken, i.e., a tomogram is to be produced, the capacitance values of the capacitors $C_s$ and $C_p$ are set to those values at which the ratio of the amplitudes of the return and forward waves is at an extreme. If the ratio Ur/Uf was formed and stored, the extreme will be the smallest among the stored values. If the ratio Uf/Ur was formed and stored, the extreme will be the largest among the stored ratios. The transmission/reception antenna 2 is thus re-matched to the impedance of the high-frequency system connected thereto, i.e., of the high-frequency line 5.

If the transmission power is maintained constant for all matching conditions of the transformation network 20, it is not necessary to form the ratio of the return and forward waves. In this case, only values corresponding to the amplitudes of the respective return waves Ur are then stored. When a tomogram is produced, the capacitance values in the transformation network 20 are set to those values corresponding to the smallest stored amplitude.

Differing from the circuit for matching the transmission/reception antenna 2, the circuit for matching the reception antenna 4 does not have an integrated patient power monitoring unit 24. The underlying principle of the method by which the circuit operates, however, is the same. In both instances, the electronic units which are present in the nuclear magnetic resonance imaging apparatus are used for tuning the antennas 2 and 4. A reception path 46 of the nuclear magnetic resonance imaging apparatus, provided for picking up the echo signals and for producing tomograms, is used for tuning the reception antenna 4. For matching its impedance, the resonator 4 is connected to a transformation network 48, constructed in the same manner as the transformation network 20 but designed only for low-power signals. An input 50 of the transformation network 48 is connected to the antenna 4, and an output 54 is connected to an input 54 of a directional coupler 56. An output 57 of the controller 42 connected to a control input of the transformation network 48. An output 58 of the directional coupler 56 is connected to a high-frequency pre-amplifier 60 via the high-frequency line 5. The output of the high-frequency pre-amplifier 60 is connected to an input of a high-frequency receiver 46 in the reception path of the nuclear magnetic resonance imaging apparatus. The directional coupler 56 has a direction-independent or primary path connected between the transformation network 48 and the high-frequency amplifier 60, so that the reception signals from the antenna 4, which are already small, are not additionally attenuated by the directional coupler 56. The high-frequency receiver 46 includes a quadrature demodulator 62. The demodulator 62 is connected via two low-pass filters 64 and 66 to respective analog-to-digital converters 68 and 70, which digitize the low-pass-filtered quadrature components. The outputs of the analog-to-digital converters 68 and 70 are supplied to the controller 42.

The directional coupler 56 has a coupling input 72 connected to a further output 74 of the modulator 6. The power of approximately −10 dBm supplied to the coupling input 72 is supplied as an output only at the terminal 54, but attenuated due to the coupling attenuation. It is thus possible to supply a low-power signal of approximately −50 dBm to the reception antenna 4. Only the signals reflected by the reception antenna 4 in the case of a mismatch will appear at the output 58 of the directional coupler 56.

The tuning procedure for tuning the reception antenna 4 follows substantially the same tuning steps described above for tuning the transmission/antenna 2. The difference is that only the amplitude Ur of the return wave is evaluated. This is possible because a defined signal is supplied to the reception antenna 4. After quadrature demodulation of the voltage of the return wave, the resultant amplitude of the quadrature components disposed perpendicular to each other is formed and stored in the controller 42. This procedure is repeated until the amplitude of the return wave has been calculated for all possible capacitance values of the parallel capacitor $C_p$ and the series capacitor $C_s$ in the transformation network 48. During the production of a tomogram, the capacitors $C_s$ and $C_p$ are set to those capacitance values at which the amplitude of the return wave Ur was smallest.

When producing a tomogram, the pre-amplifier 60 amplifies the reception signals from both the reception antenna 4 and the transmission/reception antenna 2, however, a connection of the transmission/reception antenna 2 to the pre-amplifier 60 has not been shown in FIG. 1. The signal-to-noise ratio which critically defines the image quality of the tomogram is also dependent on the noise factor of the pre-amplifier 60 belonging to the high-frequency system, as well as being dependent on the matching of the impedance of the transmission/reception antenna 2, or of the reception antenna 4 connected to the high-frequency system. If an extremely low-noise pre-amplifier 60 is used, a certain mismatch of the antennas 2 or 4 can exist without degrading the image quality. This allowable mismatching can be used to set the capacitances of the capacitors $C_s$ and $C_p$ in steps, instead of continuously.

Figure 2:
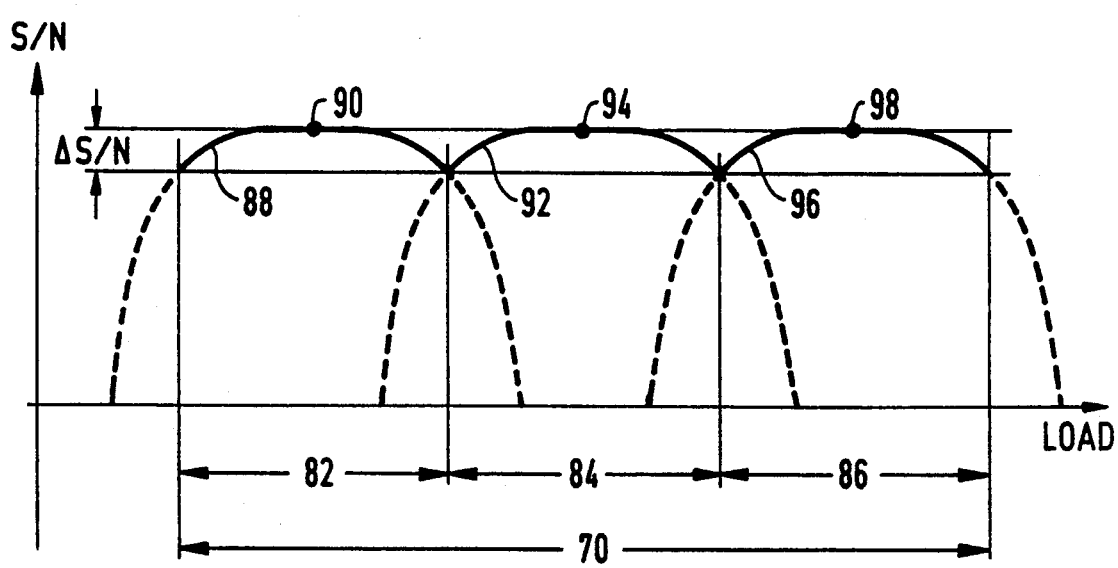
FIG. 2 shows a characteristic curve of the signal-to-noise ratio given step-by-step variation of the matching of the resonator or antenna in the circuit of FIG. 1.

The number of capacitance steps of the capacitors $C_s$ and $C_p$ becomes fewer as the noise factor of the pre-amplifier 60 in the reception path of the nuclear magnetic resonance imaging apparatus decreases. Decreasing the number of capacitance steps also reduces the time needed for matching the antennas 2 or 4. It has been shown that, given a noise factor of 1 dB, the allowable amplitude of the return wave 5 be up to 10% of the amplitude of the forward wave. If however, a pre-amplifier having a noise factor below 0.5 dB is used, the amplitude of the reflection can then be up to 20% of the amplitude of the forward wave, without noticeable losses of image quality occurring in the tomogram. A slight deterioration of the signal-to-noise ratio is accepted and the range of the impedance of the antennas 2 or 4 is thus bridged between defined 50 ohm matching points, at which the optimum of the signal-to-noise ratio is achieved. The transmission/reception antenna 2 must accommodate the largest load variation when used as a body resonator 2, in which case three matching steps are sufficient given the use of a pre-amplifier 60 having a noise factor of 0.5 dB. The overall load range in FIG. 2 is indicated by reference numeral 80, and the three matching steps are identified by reference numerals 82, 84 and 86. The signal-to-noise ratio S/N is entered on the vertical axis. The allowable reduction in the signal-to-noise ratio is indicated by $\Delta S/N$. The curve 88 represents the signal-to-noise ratio S/N in the matching step 82 dependent on the load, i.e., on the size of the patient. The antenna 2 is optimally matched at point 90. The optimum matching can be achieved in the region 82 only for a single, specific load, i.e., for a specific patient size. The same considerations are valid for the load range 84 having a curve 92 for the signal-to-noise ratio S/N with an optimum matching point 94, and for the load range 86 having a curve 96 with an optimum matching point 98.

The optimum matching points 90, 94 and 98 are tuned to 50 ohms upon initial activation of the antenna 2 or 4, or may already be tuned thereto during assembly and testing in the factory, with a defined test load. This procedure is referred to as service tuning, and can be undertaken with the above-described circuits. The capacitance values for the capacitors $C_s$ and $C_p$ are thereby defined in the individual switching steps 82, 84 and 86.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for matching a transmission/reception antenna in a magnetic resonance imaging apparatus to the impedance of a high-frequency system connected to said transmission/reception antenna via a transformation network, said transformation network being settable at a plurality of settings, each setting defining a different impedance for said transmission/reception antenna, said method comprising the steps:

(a) for a setting of said transmission network, generating a high-frequency pulse in said high-frequency system having a pulse length between 1 ms and 50 ms and a power of substantially 100 W and thereby causing a forward voltage wave to be supplied to said transmission/reception antenna resulting, in the event of mismatching, in an associated return voltage wave reflected by said transmission/reception antenna;

(b) demodulating each forward voltage wave and its associated return voltage wave;

(c) detecting a peak amplitude value of the each demodulated forward voltage wave and its associated demodulated return voltage wave;

(d) forming a ratio of the peak amplitude values of each forward voltage wave and its associated return voltage wave and storing said ratio;

(e) repeating steps (a), (b), (c) and (d) for each impedance of said transmission/reception antenna which can be respectively defined by said settings of said transmission network and thereby obtaining a plurality of stored ratios respectively corresponding to said different impedances of said transmission/reception antenna, said plurality of stored ratios including an extreme ratio; and (f) during generation of a tomogram of a subject, setting said transformation network at a setting which defines an impedance of said transmission/reception antenna corresponding to said extreme ratio.

2. A method as claimed in claim 1 wherein the step of forming a ratio is further defined by forming a ratio of each forward voltage wave to its associated reverse voltage wave, and wherein said extreme ratio is a maximum ratio among said plurality of stored ratios.

3. A method as claimed in claim 1 wherein the step of forming a ratio is further defined by forming a ratio of each reverse voltage wave to its associated forward wave, and wherein said extreme ratio is a minimum ratio among said plurality of stored ratios.

4. A method as claimed in claim 1 comprising the additional step of digitizing said demodulated forward voltage wave and reverse voltage wave.

5. A method as claimed in claim 1 wherein step (e) is further defined by repeating steps (a), (b), (c) and (d) by changing the impedance of said transformation network in steps with the number of said steps being selected so that a prescribed signal-to-noise ratio is exceeded given a matched transmission/reception antenna.

6. A method as claimed in claim 5 comprising the additional step of connecting a high-frequency receiver in said high-frequency system having a noise factor of a maximum of 0.5 dB, and wherein a maximum number of said steps is three.

7. A method for matching a transmission/reception antenna in magnetic resonance imaging apparatus to the impedance of a high-frequency system connected to said transmission/reception antenna via a transformation network, said transformation network being settable at a plurality of settings, each setting defining a different impedance for said transmission/reception antenna, said method comprising the steps of:

(a) for a setting of said transmission network, generating a high-frequency pulse in said high-frequency system and thereby causing a forward voltage wave to be supplied to said transmission/reception antenna, said forward voltage wave having an associated return voltage wave reflected by said transmission/reception antenna associated therewith;

(b) demodulating said return voltage wave;

(c) detecting a peak amplitude value of the demodulated return voltage wave and storing said peak amplitude value;

(d) repeating steps (a), (b) and (c) at a substantially constant HF pulse power for each impedance of said transmission/reception antenna which can be respectively defined by said settings of said transformation network and thereby obtaining a plurality of stored peak amplitude values respectively corresponding to different impedances of said transmission/reception antenna, and including a minimum stored peak amplitude value; and (e) during obtaining a tomogram of a subject, setting said transformation work at a setting which defines an impedance of said transmission/reception antenna corresponding to said minimum stored peak amplitude value.

8. A method as claimed in claim 7 comprising the additional step of digitizing said demodulated forward voltage wave and reverse voltage wave.

9. A method as claimed in claim 7 wherein step (e) is further defined by repeating steps (a), (b), (c) and (d) by changing the impedance of said transformation network in steps with the number of said steps being selected so that a prescribed signal-to-noise ratio is exceeded given a matched transmission/reception antenna.

10. A method as claimed in claim 9 comprising the additional step of connecting a high-frequency receiver in said high-frequency system having a noise factor of a maximum of 0.5 dB, and wherein a maximum number of said steps is three.

11. A method for matching a reception antenna in a magnetic resonance imaging apparatus to the impedance of a high-frequency system connected to said reception antenna via a transformation network, said transformation network being settable at a plurality of settings, each setting defining a different impedance for said reception antenna, said method comprising the steps of:

(a) for a setting of said transformation network, generating a high-frequency signal in said high-frequency system having a power below −10 dBm and thereby causing a forward voltage wave to be supplied to said reception antenna, said forward voltage wave having an associated return voltage wave reflected by said reception antenna;

(b) demodulating said return voltage wave;

(c) detecting a peak amplitude value of the demodulated return voltage wave and storing said peak amplitude value;

(d) repeating steps (a), (b) and (c) for each impedance of said reception antenna which can be respectively defined by said settings of said transformation network and thereby obtaining a plurality of stored peak amplitude values respectively corresponding to different impedances of said reception antenna, and including a minimum value; and (e) during obtaining a tomogram of a subject, setting said transformation network at a setting which defines an impedance of said reception antenna corresponding to said minimum value.

12. A method as claimed in claim 11 comprising the additional step of digitizing said demodulated forward voltage wave and reverse voltage wave.

13. A method as claimed in claim 11 wherein step (e) is further defined by repeating steps (a), (b), (c) and (d) by changing the impedance of said transformation network in steps with the number of said steps being selected so that a prescribed signal-to-noise ratio is exceeded given a matched transmission/reception antenna.

14. A method as claimed in claim 13 comprising the additional step of connecting a high-frequency receiver in said high-frequency system having a noise factor of a maximum of 0.5 dB, and wherein a maximum number of said steps is three.

15. A method as claimed in claim 11 wherein step (a) is further defined by generating a high-frequency pulse.

16. A method as claimed in claim 11 wherein step (a) is further defined by generating a continuous-wave high-frequency signal.

* * * * *